United States Patent [19]
Sekimoto

[11] Patent Number: 5,966,031
[45] Date of Patent: Oct. 12, 1999

[54] OUTPUT CIRCUIT FOR INTEGRATED CIRCUIT DEVICES

[75] Inventor: Yasuhiko Sekimoto, Hamamatsu, Japan

[73] Assignee: Yahama Corporation, Hamamtsu, Japan

[21] Appl. No.: 08/921,192

[22] Filed: Aug. 29, 1997

[30] Foreign Application Priority Data

Sep. 2, 1996 [JP] Japan ................................. 8-250994

[51] Int. Cl.$^6$ ............................................. H03K 19/0185
[52] U.S. Cl. .................................. 326/83; 326/27; 326/58
[58] Field of Search ................................ 326/26–27, 83, 326/86–87, 57–58, 121

[56] References Cited

U.S. PATENT DOCUMENTS

| | | | |
|---|---|---|---|
| 5,144,161 | 9/1992 | Inaba | 326/83 |
| 5,319,260 | 6/1994 | Wanlass | 326/26 |
| 5,534,791 | 7/1996 | Mattos et al. | 326/87 |
| 5,537,060 | 7/1996 | Baek | 326/87 |
| 5,583,451 | 12/1996 | Sharpe-Geisler | 326/83 |
| 5,670,894 | 9/1997 | Takaishi et al. | 326/27 |
| 5,719,509 | 2/1998 | Chan | 326/87 |

*Primary Examiner*—Jon Santamauro
*Attorney, Agent, or Firm*—Graham & James LLP

[57] ABSTRACT

An output circuit for an integrated circuit device in which first and second power wirings are connected to a high-potential power terminal, third and fourth power wirings are connected to a low-potential power terminal, and a plurality of inverters are responsive, respectively, to a plurality of bit data signals, each being formed of P-channel and N-channel MOS transistors having drains thereof connected together, a junction of which forms an output terminal. First to fourth auxiliary transistors are provided for each of the inverters, which are connected, respectively, between the first power wiring and the source of the P-channel MOS transistor, between the second power wiring and the source of the P-channel MOS transistor, between the third power wiring and the source of the N-channel MOS transistor, and between the fourth power wiring and the source of the N-channel MOS transistor. First and second circuits are provided for each inverter and operable in response to one of the bit signals corresponding to each inverter to control the transistors ON and OFF states.

3 Claims, 13 Drawing Sheets

OUTPUT CIRCUIT FOR INTEGRATED CIRCUIT DEVICES

BACKGROUND OF THE INVENTION

1. Field of the Invention

The present invention relates to an output circuit for integrated circuit devices, such as CMOS (complementary MOS) LSIs, and more particularly to an output circuit of this kind, which includes a plurality of CMOS inverters which drive a plurality of respective loads which are substantially capacitive (hereinafter referred to as "capacitive load(s)") connected to the output circuit in response to a multi-bit data signal.

2. Prior Art

Conventionally, an output circuit for CMOS LSIs shown in FIG. 1 is known. An IC chip 10 has formed thereon a circuit, not shown, for generating data signals IN1 to INn indicative of n-bit data (n being an integer of 3 or more), and an output circuit for transferring the data signals IN1 to IN$n$ from the above-mentioned circuit to output terminals O1 to O$n$. The output circuit includes tristate output blocks provided for respective different-bit data signals IN1 to IN$n$, each having a prebuffer as designated by PB1 and an output buffer as designated by PB1.

In the output block which handles the data signal IN1, the prebuffer PB1 is comprised of an inverter IV which receives an output enable signal OEN, a NAND gate NA$a$ which receives an output signal OE from the inverter IV and the data signal IN1, and a NAND gate NA$b$ which receives the output enable signal OEN and the data signal IN1. The output buffer OB1 is formed by a CMOS inverter comprised of a P-channel MOS transistor P1 and an N-channel MOS transistor N1 which have their drains connected together. The transistor P1 has its source connected via a power wiring $V_D$ to a power terminal T1 which is supplied with a high voltage or potential $V_{DD}$, and the transistor N1 has its source connected via a power wiring $V_S$ to a power terminal T2 which is supplied with a low voltage or potential $V_{SS}$. The transistors P1 and N1 have their gates supplied, respectively, with an output signal from the NAND gate NA$a$ and an output signal from the NAND gate NA$b$ to be driven thereby.

When the output enable signal OEN is at a low ("L") level, the output signal OE from the inverter IV assumes a high ("H") level. Accordingly, the NAND gates NA$a$ and NA$b$ both generate output signals which are inverted in phase to the data signal IN1. For example, when the data signal IN1 goes high ("H"), the output signals from the gates NA$a$, NA$b$ both go low ("L"), so that the transistors P1, N1 are turned on and off, respectively, and hence an output signal from the output terminal O1 goes "H". When the data signal IN1 goes "L", the gate output signals change inversely to the above to turn the transistors into inverse states to the above so that the output signal from the output terminal O1 goes "L".

On the other hand, when the output enable signal OEN goes "H", the output signal OE from the inverter IV goes "L", so that the NAND gates NA$a$ and NA$b$ generate output signals at "H" and "L", respectively, irrespective of the level of the data signal IN1, and hence the transistors P1 and N1 are both turned off to bring the output terminal O1 into a high-impedance (or floating) state.

The output blocks which handle the data signals IN2 to IN$n$ are identical in construction and operation with the output block handling the data signal IN1, described above.

In the figure, reference numerals PB2 to PB$n$ designate prebuffers similar to the prebuffer PB1, OB2 to OB$n$ output buffers similar to the output buffer OB1, P2 to P$n$ P-channel MOS transistors similar to the transistor P1, and N2 to N$n$ N-channel MOS transistors similar to the transistor N1. Capacitive loads are connected to the output terminal O1 and output terminals O2 to O$n$, respectively.

The IC chip 10 is packed in an IC package, not shown. The IC package has leads connected to inputs of other LSI(s) or the like via a connector or a common bus. The power terminals T1, T2 and the output terminals O1 to On correspond to leads of the IC package. Inductances $L_D$ and $LS$ exist between the leads corresponding to the power terminals T1, T2 and the IC chip 10, which are ascribed to IC package leads, bonding wires, etc. The inductances $L_D$, $LS$ are usually of the order of several nH to about 2 dozens nH. The capacitive loads C1 to C$n$ connected to the output terminals O1 to O$n$ are equivalent to substantial input capacitance present at the inputs of an LSI(s) connected to the output of the output device and wiring capacitance, and desirably they should not exist.

The output circuit according to the prior art constructed as above has the disadvantage that a malfunction can be caused by discharge of a capacitive load(s) such as C1 when a transistor forming the output buffer, such as N1, is turned on.

FIG. 2 shows essential parts of the output circuit of FIG. 1 for use in explaining the above disadvantage. In the figure, elements corresponding to those in FIG. 1 are designated by identical reference numerals.

In FIG. 2, reference numeral OB2 designates the output buffer handling the data signal IN2, which is formed by a CMOS inverter comprised of a P-channel MOS transistor P2 and an N-channel MOS transistor N2 which have their drains connected together.

The transistors P2, N2 are disposed to be turned off and on, respectively, when "H" level signals are applied to the gates thereof, whereby the output terminal O2 generates a "L" level output signal. In this state, if the input signals to the gates of the transistors P1, N1 of the output buffer OB1 rise from "L" level to "H" level, the transistors P1, N1 turn off and on, respectively, whereby the electric charge of the capacitive load C1 is discharged through a path of output terminal O1, transistor N1, power wiring $V_S$, and inductance $L_S$, so that discharge current I flows through the path.

When the discharge current I flows in the inductance $L_S$, an electromotive force $\Delta V$ is generated in the inductance $L_S$, which is expressed by the following equation (1):

$$\Delta V = -L_S \times dI/dt \qquad (1)$$

Consequently, a bound of voltage occurs due to the electromotive force $\Delta V$ at a point X corresponding to the source of the transistor N2. A waveform (ringing waveform) similar to the waveform of voltage bound at the point X also appears at the output terminal O2, though the potential change at the output terminal O2 is somewhat dull due to a time constant determined by the On-state resistance of the transistor N2 and the capacitance of the capacitive load B2.

FIG. 3 shows the ringing waveform WO2 appearing at the output terminal O2 as well as the voltage waveform WO1 appearing at the output terminal O1. If the LSI connected to the output of the output circuit is a TTL (transistor-transistor logic) type, the "L" input voltage VIL to the TTL (the upper limit voltage that can be recognized to a "L" input voltage by the LSI) is 0.8 V. Therefore, if a peak of the ringing waveform WO2 exceeds the value VIL (=0.8 V), the LSI can erroneously recognize the ringing waveform WO2 as a "H"

level signal and hence malfunction, though the output signal at the output terminal O2 is at "L" level.

Further, when the gate voltages applied to the transistors P2, N2 are at "L" level (the output signal at the output terminal O2 is at "H" level), if the gate voltages to the transistors P1, N1 change from "H" level to "L" level, the transistors P1, N1 turn on and off, respectively, whereby the capacitive load C1 is charged by current flowing through a path of inductance $L_D$, power wiring $V_D$, transistor P1, and output terminal O1. The charge current flowing on this occasion causes a ringing waveform as indicated by Q16 in FIG. 7 to occur at a point Y corresponding to the source of the transistor P1. This ringing waveform is transmitted to the capacitive load C2 via the transistor P2 and the output terminal O2. Consequently, the LSI connected to the output can erroneously recognize the ringing waveform as a "L" level signal and hence malfunction, though the output signal at the output terminal O2 is at "H" level.

One measure to prevent a malfunction of a device connected to the output due to charging or discharging of the capacitive load is to provide as the power wiring $V_S$ a plurality of separate power wirings, respectively, for the transistors N1, N2, . . . N$n$ and provide as the power wiring $V_D$ a plurality of separate power wirings, respectively, for the transistors P1, P2, . . . P$n$. However, according to this measure, if the number of bits of the data signals employed is large, the number of power wirings used becomes very large, i.e. as many as 2×n (e.g. 16 if n=8).

SUMMARY OF THE INVENTION

It is the object of the invention to provide an output circuit for integrated circuit devices, which is capable of preventing a malfunction of a device connected to the output thereof due to charging or discharging of a capacitive load connected to the output, without an increase in the number of power wirings used.

To attain the above object, according to a first aspect of the invention, there is provided an output circuit for an integrated circuit device, comprising a first power terminal which is supplied with a high potential, first and second power wirings connected to the first power terminal, a second power terminal which is supplied with a low potential, third and fourth power wirings connected to the second power terminal, a plurality of inverters responsive, respectively, to a plurality of bit signals constituting a data signal, each of the inverters being formed of P-channel and N-channel MOS transistors having drains thereof connected together, a junction of which forms an output terminal, first to fourth auxiliary transistors provided for each of the inverters and each having a source, the first auxiliary transistor being connected between the first power wiring and the source of the P-channel MOS transistor, the second auxiliary transistor being connected between the second power wiring and the source of the P-channel MOS transistor, the third auxiliary transistor being connected between the third power wiring and the source of the N-channel MOS transistor, and the fourth auxiliary transistor being connected between the fourth power wiring and the source of the N-channel MOS transistor, a first circuit provided for the each of the inverters and operable in response to one of the bit signals corresponding to the each of the inverters, for controlling the third and fourth auxiliary transistors such that the third auxiliary transistor is in ON state during a first predetermined time period including timing of turning-on of the N-channel MOS transistor, and turned off after termination of the first predetermined period, and the fourth auxiliary transistor is turned on after the turning-off of the third auxiliary transistor, and a second circuit provided for the each of the inverters and operable in response to the one of the bit signals corresponding to the each of the inverters, for controlling the first and second auxiliary transistors such that the first auxiliary transistor is in ON state during a second predetermined time period including timing of turning-on of the P-channel MOS transistor, and turned off after termination of the second predetermined period, and the second auxiliary transistor is turned on after the turning-off of the first auxiliary transistor.

In the output circuit according to the first aspect constructed above, when the N-channel MOS transistor of a first inverter is turned on, the third auxiliary transistor is in ON state during a first time period including the timing of turning-on of the N-channel MOS transistor. Accordingly, discharge current flows through a path of a capacitive load connected to the output terminal, N-channel MOS transistor, third auxiliary transistor, and third power wiring, whereby a ringing waveform is produced on the third power wiring. At this time, the fourth auxiliary transistor is in OFF state, so that no ringing waveform appears on the fourth power wiring. On the other hand, in a second inverter, when the output signal is at "L" level, after the lapse of the first predetermined time period from the turning-on of the N-channel MOS transistor, the third and fourth auxiliary transistors turn off and on, respectively, so that the ringing waveform produced on the third power wiring is impeded by the third auxiliary transistor in OFF state from being transmitted to the capacitive load.

In the first inverter, after the lapse of the first predetermined time period, the third auxiliary transistor turns off, and following the turning-off of the third auxiliary transistor, the fourth auxiliary transistor turns on. If the timing of turning-on of the fourth auxiliary transistor is set to coincide with a time point at which the ringing waveform caused by the discharge current from the capacitive load decays to a neglible level, no adverse ringing waveform appears on the fourth power wiring when the fourth auxiliary transistor turns on. Therefore, in the second inverter, even when the fourth auxiliary transistor turns on, a ringing waveform does not reach the capacitive load.

According to the operation of the output circuit according to the first aspect during discharging of a capacitive load, a ringing waveform due to discharge current from the capacitive load is not transmitted to another capacitive load(s), whereby malfunctioning of a device connected to the output of the output circuit due to discharge of the capacitive load can be prevented.

On the other hand, in the output circuit according to the first aspect, when the P-channel MOS transistor of the first inverter is turned on, the first auxiliary transistor is in ON state during a second time period including the timing of turning-on of the P-channel MOS transistor. Accordingly, charge current flows through a path of first power wiring, first auxiliary transistor, P-channel MOS transistor, and capacitive load, whereby a ringing waveform is produced on the first power wiring. At this time, the second auxiliary transistor is in OFF state, so that no ringing waveform appears on the second power wiring. On the other hand, in the second inverter, when the output signal is at "H" level, after the lapse of the second predetermined time period from the turning-on of the P-channel MOS transistor, the first and second auxiliary transistors turn off and on, respectively, so that the ringing waveform produced on the first power wiring is impeded by the first auxiliary transistor in OFF state from being transmitted to the capacitive load.

In the first inverter, after the lapse of the second predetermined time period, the first auxiliary transistor turns off, and following the turning-off of the first auxiliary transistor, the second auxiliary transistor turns on. If the timing of turning-on of the second auxiliary transistor is set to coincide with a time point at which the ringing waveform caused by the charge current from the capacitive load decays to a neglible level, no adverse ringing waveform appears on the second power wiring when the second auxiliary transistor turns on. Therefore, in the second inverter, even when the second auxiliary transistor turns on, a ringing waveform does not reach the capacitive load.

According to the operation of the output circuit according to the first aspect during charging of a capacitive load, a ringing waveform due to charge current into the capacitive load is not transmitted to another capacitive load(s), whereby malfunctioning of the device connected to the output of the output circuit due to charge of the capacitive load can be prevented.

In the output circuit according to the first aspect, the ringing waveform-preventing means on either the P-channel MOS transistor side or the N-channel MOS transistor side of each inverter may be omitted. More specifically, when there is no possibility that the device connected to the output of the output device malfunctions due to a ringing waveform produced on the first power line, the first and second auxiliary transistors may be omitted for each inverter. the second power wiring may be omitted, and the source of the P-channel MOS transistor may be connected to the first power line, for each inverter. Further, when there is no possibility that the device connected to the output of the output device malfunctions due to a ringing waveform produced on the third power line, the third and fourth auxiliary transistors may be omitted for each inverter. the fourth power wiring may be omitted, and the source of the N-channel MOS transistor may be connected to the first power line, for each inverter.

That is, the present invention also provides the following variations of the first aspect which have simplified constructions:

An output circuit for an integrated circuit device, comprising a first power terminal which is supplied with a high potential, a first power wiring connected to the first power terminal, a second power terminal which is supplied with a low potential, second and third power wirings connected to the second power terminal, a plurality of inverters responsive, respectively, to a plurality of bit signals constituting a data signal, each of the inverters being formed of P-channel and N-channel MOS transistors having drains thereof connected together, a junction of which forms an output-terminal, a capacitive load being substantially connected to the output terminal, the P-channel MOS transistor having a source thereof connected to the first power wiring, first and second auxiliary transistors provided for each of the inverters and each having a source, the first auxiliary transistor being connected between the second power wiring and the source of the N-channel MOS transistor, and the second auxiliary transistor being connected between the third power wiring and the source of the N-channel MOS transistor, and a circuit provided for the each of the inverters and operable in response to one of the bit signals corresponding to the each of the inverters, for controlling the first and second auxiliary transistors such that the first auxiliary transistor is in ON state during a predetermined time period including timing of turning-on of the N-channel MOS transistor, and turned off after termination of the predetermined period, and the second auxiliary transistor is turned on after the turning-off of the first auxiliary transistor.

An output circuit for an integrated circuit device, comprising a first power terminal which is supplied with a high potential, first and second power wirings connected to the first power terminal, a second power terminal which is supplied with a low potential, a third power wiring connected to the second power terminal, a plurality of inverters responsive, respectively, to a plurality of bit signals constituting a data signal, each of the inverters being formed of P-channel and N-channel MOS transistors having drains thereof connected together, a junction of which forms an output terminal, the N-channel MOS transistor having a source thereof connected to the third power wiring, first and second auxiliary transistors provided for each of the inverters and each having a source, the first auxiliary transistor being connected between the first power wiring and the source of the P-channel MOS transistor, and the second auxiliary transistor being connected between the second power wiring and the source of the P-channel MOS transistor, and a circuit provided for the each of the inverters and operable in response to one of the bit signals corresponding to the each of the inverters, for controlling the first and second auxiliary transistors such that the first auxiliary transistor is in ON state during a predetermined time period including timing of turning-on of the P-channel MOS transistor, and turned off after termination of the predetermined period, and the second auxiliary transistor is turned on after the turning-off of the first auxiliary transistor.

To attain the above object, according to a second aspect of the invention, there is provided an output circuit for an integrated circuit device, comprising a first power terminal which is supplied with a high potential, first and second power wirings connected to the first power terminal, a second power terminal which is supplied with a low potential, third and fourth power wirings connected to the second power terminal, a plurality of inverters responsive, respectively, to a plurality of bit signals constituting a data signal, each of the inverters being formed of P-channel and N-channel MOS transistors having drains thereof connected together, a junction of which forms an output terminal, the P-channel MOS transistor having a source thereof connected to the first power wiring, and the N-channel MOS transistor having a source thereof connected to the third power wiring, first and second auxiliary transistors provided for each of the inverters and each having a source, the first auxiliary transistor being connected between the second power wiring and the drain of the P-channel MOS transistor, and the second auxiliary transistor being connected between the fourth power wiring and the drain of the N-channel MOS transistor, a first circuit provided for the each of the inverters and operable in response to one of the bit signals corresponding to the each of the inverters, for controlling the N-channel MOS transistor and the second transistor such that the N-channel MOS transistor is turned on, held in ON state for a first predetermined time period, and turned off after termination of the first predetermined time period, and the second auxiliary transistor is turned on after the turning-off of the N-channel MOS transistor, and a second circuit provided for the each of the inverters and operable in response to the one of the bit signals corresponding to the each of the inverters, for controlling the P-channel MOS transistor and the first auxiliary transistor such that the P-channel MOS transistor is turned on, held in ON state for a second predetermined time period, and turned off after termination of the second predetermined time period, and the first auxiliary transistor is turned on after the turning-off of the P-channel MOS transistor.

In the output circuit according to the second aspect constructed above, once the N-channel MOS transistor of a first inverter is turned on, the ON state of the same transistor is continued for a first time period. Accordingly, discharge current flows through a path of a capacitive load connected to the output terminal, N-channel MOS transistor, and third auxiliary transistor, whereby a ringing waveform is produced on the third power wiring. At this time, the second auxiliary transistor is in OFF state, so that no ringing waveform appears on the fourth power wiring. On the other hand, inca second inverter, when the output signal is at "L" level, after the lapse of the first predetermined time period from the turning-on of the N-channel MOS transistor, the N-channel MOS transistor and the second auxiliary transistors turn off and on, respectively, so that the ringing waveform produced on the third power wiring is impeded by the N-channel MOS transistor in OFF state from being transmitted to the capacitive load.

In the first inverter, after the lapse of the first predetermined time period, the N-channel MOS transistor turns off, and following the turning-off of the N-channel MOS transistor, the second auxiliary transistor turns on. If the timing of turning-on of the second auxiliary transistor is set to coincide with a time point at which the ringing waveform caused by the discharge current from the capacitive load decays to a neglible level, no adverse ringing waveform appears on the fourth power wiring when the second auxiliary transistor turns on. Therefore, in the second inverter, even when the second auxiliary transistor turns on, a ringing waveform does not reach the capacitive load.

According to the operation of the output circuit according to the second aspect during discharging of a capacitive load, a ringing waveform due to discharge current from the capacitive load is not transmitted to another capacitive load(s), whereby malfunctioning of a device connected to the output of the output circuit due to discharge of the capacitive load can be prevented.

On the other hand, in the output circuit according to the second aspect, when the P-channel MOS transistor of the first inverter is turned on, the ON state of the same transistor is continued for a second time period. Accordingly, charge current flows through a path of first power wiring, P-channel MOS transistor, and capacitive load, whereby a ringing waveform is produced on the first power wiring. At this time, the first auxiliary transistor is in OFF state, so that no ringing waveform appears on the second power wiring. On the other hand, in the second inverter, when the output signal is at "H" level, after the lapse of the second predetermined time period from the turning-on of the P-channel MOS transistor, the P-channel MOS transistor and the first auxiliary transistors turn off and on, respectively, so that the ringing waveform produced on the first power wiring is impeded by the P-channel MOS transistor in OFF state from being transmitted to the capacitive load.

In the first inverter, after the lapse of the second predetermined time period, the P-channel MOS transistor turns off, and following the turning-off of the P-channel MOS transistor, the first auxiliary transistor turns on. If the timing of turning-on of the first auxiliary transistor is set to coincide with a time point at which the ringing waveform caused by the charge current from the capacitive load decays to a neglible level, no adverse ringing waveform appears on the second power wiring when the first auxiliary transistor turns on. Therefore, in the second inverter, even when the first auxiliary transistor turns on, a ringing waveform does not reach the capacitive load.

According to the operation of the output circuit according to the second aspect during charging of a capacitive load, a ringing waveform due to charge current into the capacitive load is not transmitted to another capacitive load(s), whereby malfunctioning of the device connected to the output of the output circuit due to charge of the capacitive load can be prevented.

In the output circuit according to the second aspect, the ringing waveform-preventing means on either the P-channel MOS transistor side or the N-channel MOS transistor side of each inverter may be omitted. More specifically, when there is no possibility that the device connected to the output of the output device malfunctions due to a ringing waveform produced on the first power line, the first auxiliary transistor may be omitted for each inverter. the second power wiring may be omitted, and the source of the P-channel MOS transistor may be connected to the first power line, for each inverter. Further, when there is no possibility that the device connected to the output of the output device malfunctions due to a ringing waveform produced on the third power line, the second auxiliary transistor may be omitted for each inverter. the fourth power wiring may be omitted, and the source of the N-channel MOS transistor may be connected to the third power line, for each inverter.

That is, the present invention also provides the following variations of the second aspect which have simplified constructions:

An output circuit for an integrated circuit device, comprising a first power terminal which is supplied with a high potential, a first power wiring connected to the first power terminal, a second power terminal which is supplied with a low potential, second and third power wirings connected to the second power terminal, a plurality of inverters responsive, respectively, to a plurality of bit signals constituting a data signal, each of the inverters being formed of P-channel and N-channel MOS transistors having drains thereof connected together, a junction of which forms an output-terminal, the P-channel MOS transistor having a source thereof connected to the first power wiring, and the N-channel MOS transistor having a source thereof connected to the second power wiring, an auxiliary transistor provided for each of the inverters and each having a source, the auxiliary transistor being connected between the third power wiring and the drain of the N-channel MOS transistor, and a circuit provided for the each of the inverters and operable in response to one of the bit signals corresponding to the each of the inverters, for controlling the N-channel MOS transistor and the auxiliary transistor such that the N-channel MOS transistor is turned on, held in ON state for a predetermined time period, and turned off after termination of the predetermined time period, and the auxiliary transistor is turned on after the turning-off of the N-channel MOS transistor.

An output circuit for an integrated circuit device, comprising a first power terminal which is supplied with a high potential, first and second power wirings connected to the first power terminal, a second power terminal which is supplied with a low potential, a third power wiring connected to the second power terminal, a plurality of inverters responsive, respectively, to a plurality of bit signals constituting a data signal, each of the inverters being formed of P-channel and N-channel MOS transistors having drains thereof connected together, a junction of which forms an output terminal, the P-channel MOS transistor having a source thereof connected to the first power wiring, and the N-channel MOS transistor having a source thereof connected to the third power wiring an auxiliary transistor provided for each of the inverters and each having a source, the auxiliary transistor being connected between the second power wiring and the drain of the P-channel MOS transistor, and a circuit provided for the each of the inverters and operable in response to one of the bit signals corresponding to the each of the inverters, for controlling the P-channel MOS transistor and the auxiliary transistor such that the P-channel MOS transistor is turned on, held in ON state for a predetermined time period, and turned off after termination of the predetermined time period, and the auxiliary transistor is turned on after the turning-off of the P-channel MOS transistor.

According to the output circuits of the first and second aspects, the number of power wirings employed can be decreased to four at most, even if the number of bits of the data signals is increased.

The above and other objects, features, and advantages of the invention will be more apparent from the following detailed description taken in conjunction with the accompanying drawings.

DETAILED DESCRIPTION

The invention will now be described in detail with reference to the drawings showing embodiments thereof.

Figure 1:
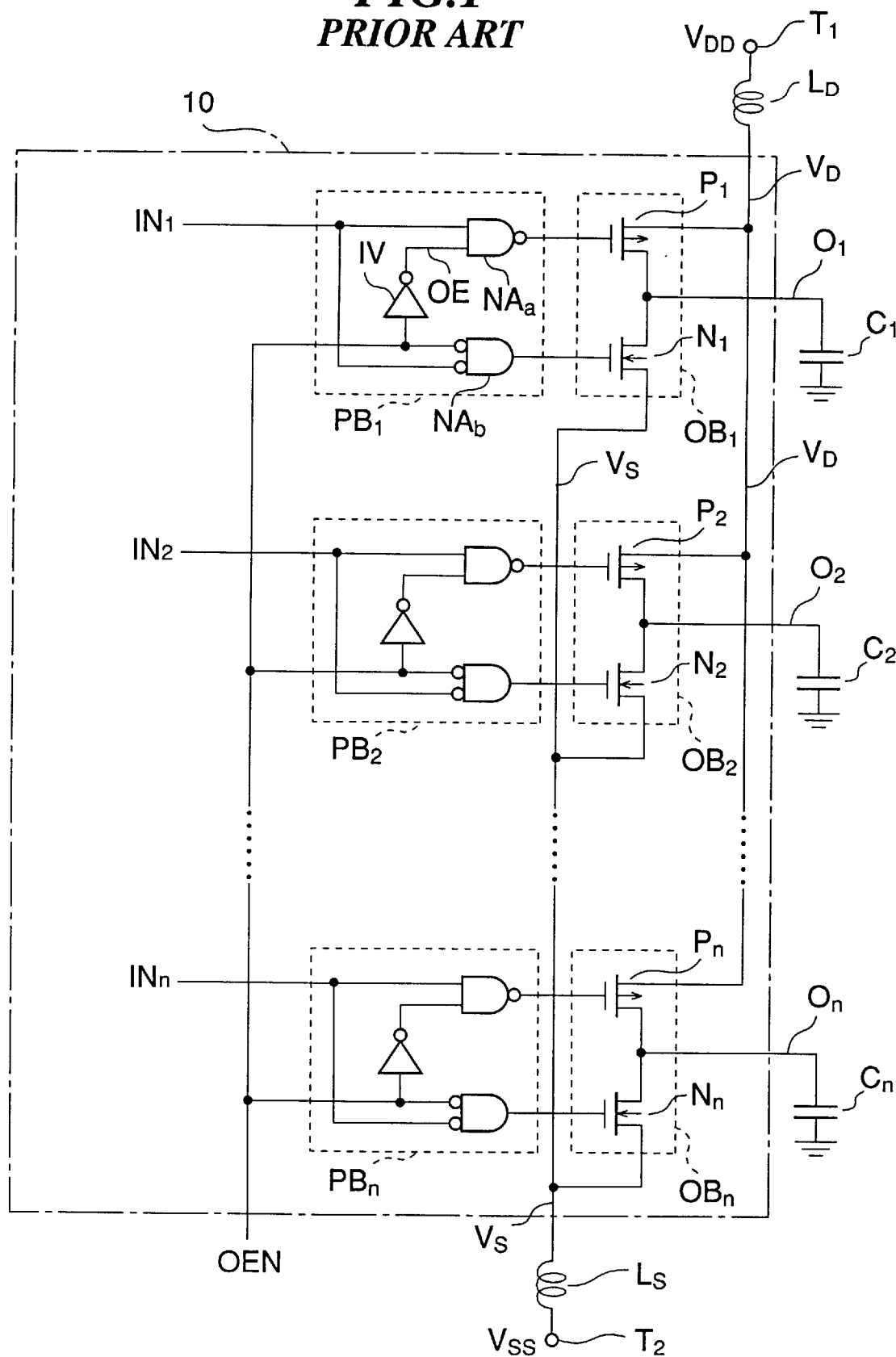
FIG. 1 is a circuit diagram showing the arrangement of a conventional output circuit for an integrated circuit device.
Figure 2:
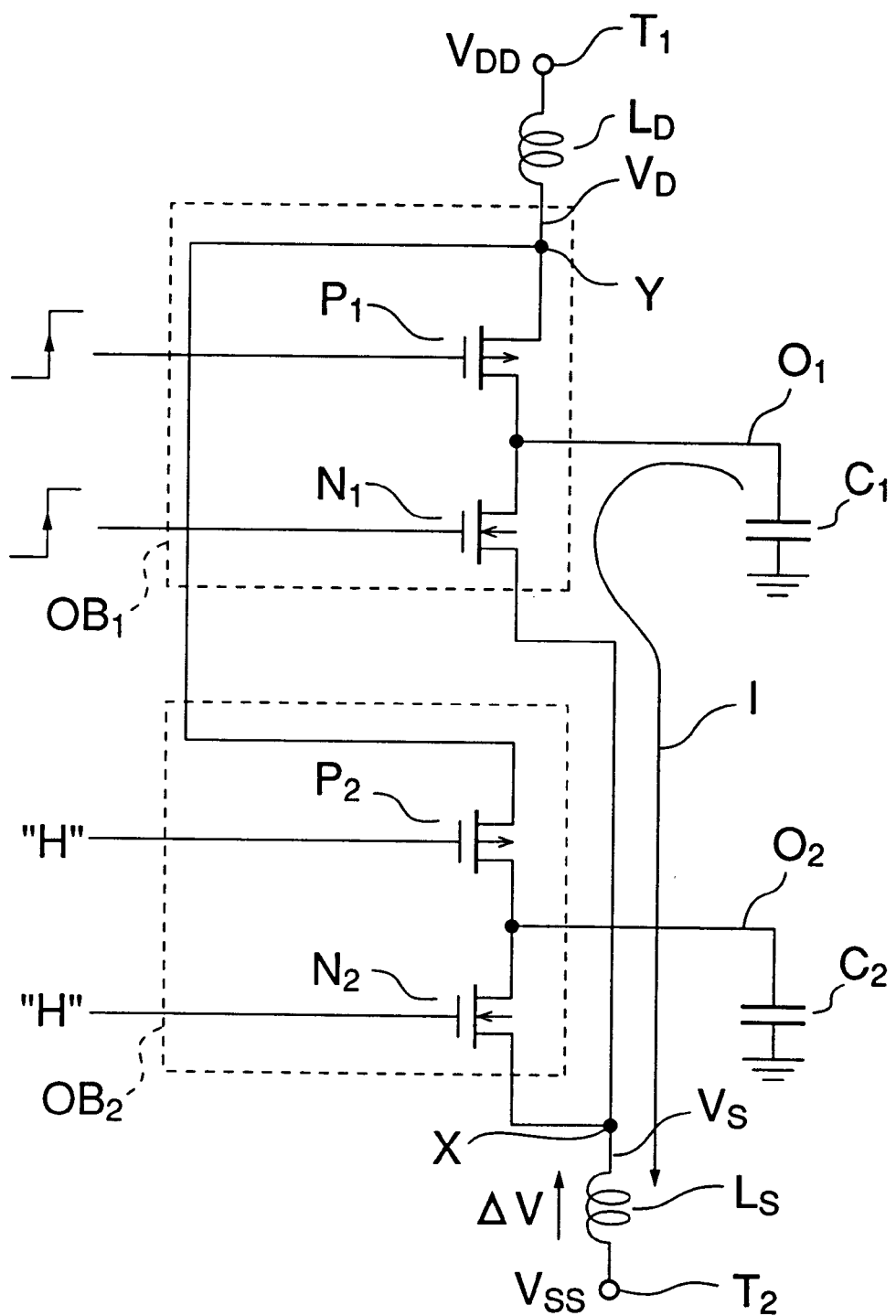
FIG. 2 is a circuit diagram showing essential parts of the output circuit of FIG. 1, which is useful in explaining a problem with the same circuit.
Figure 4:
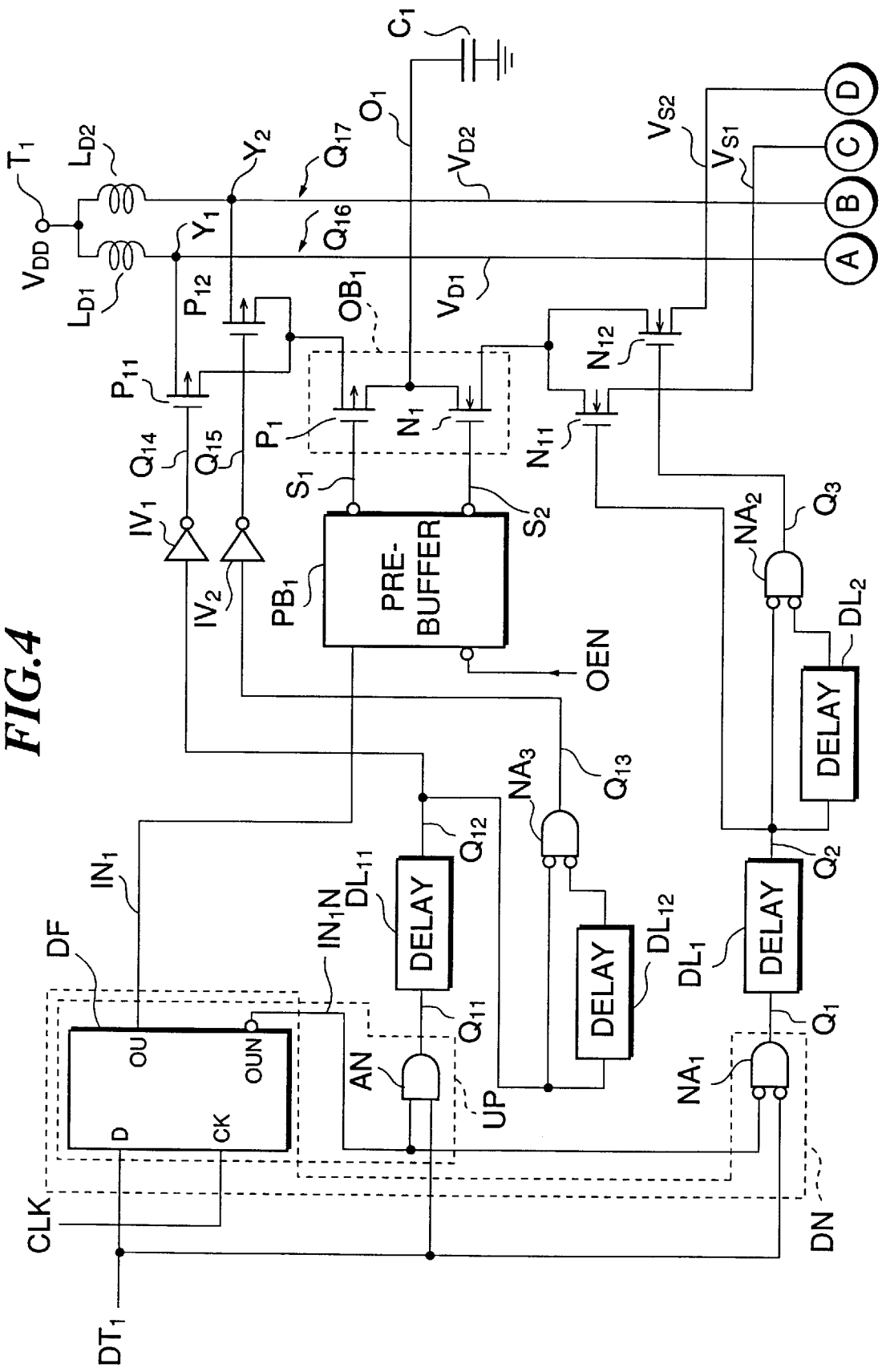
FIG. 4 is a circuit diagram showing the arrangement of an output block for a first-bit data signal, of an output circuit for an integrated circuit device according to a first embodiment of the invention.
Figure 5:
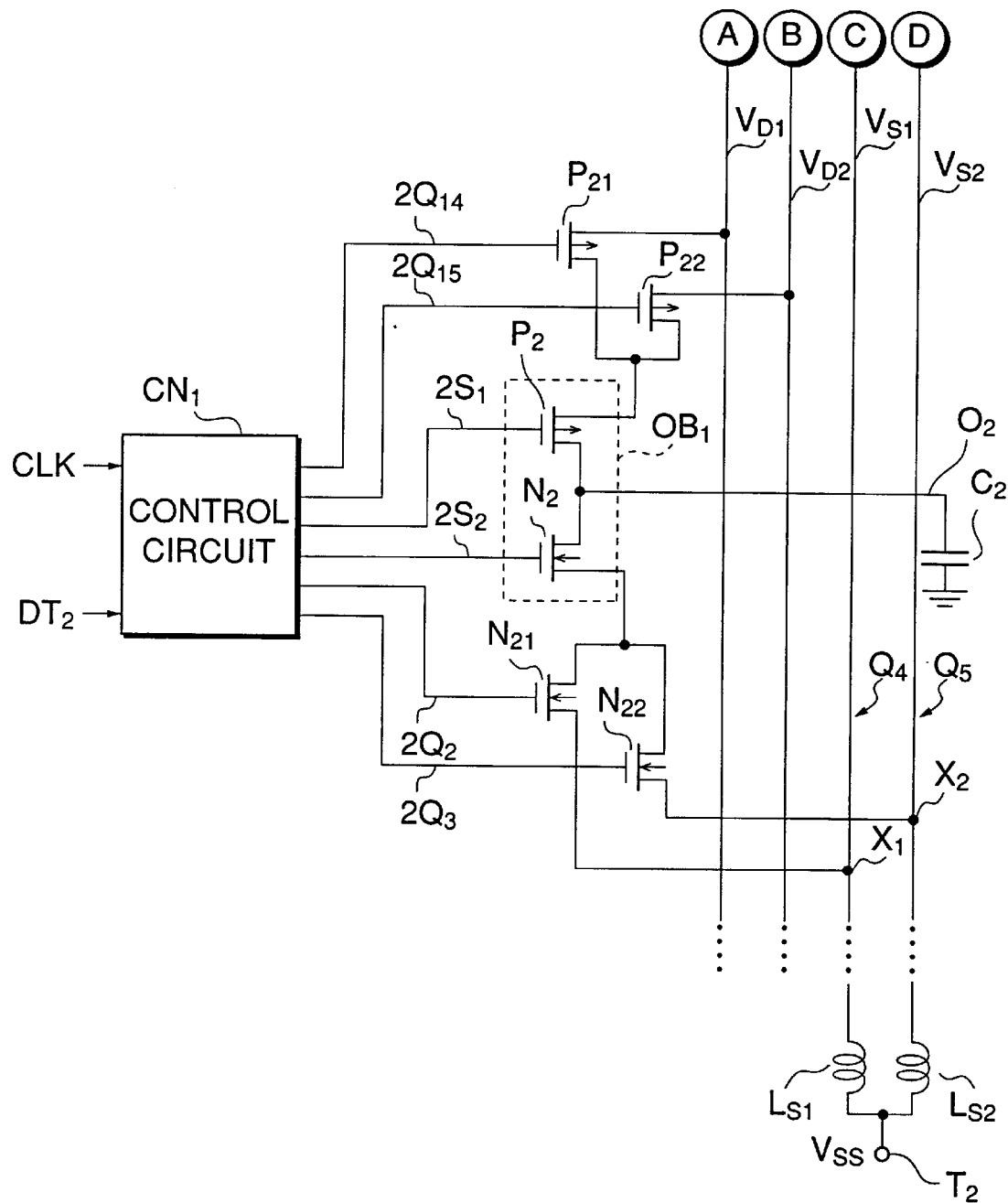
FIG. 5 is a circuit diagram showing the arrangement of an output block for a second-bit data signal, of the output circuit according to the first embodiment.

Referring to FIGS. 4 and 5, there is illustrated the arrangement of an output circuit for integrated circuit devices according to a first embodiment of the invention. In the figures, elements, signals and parameters corresponding to those in FIGS. 1 and 2 are designated by identical reference numerals, detailed description of which is omitted. FIG. 4 shows the arrangement of an output block which handles a first-bit data signal DT1 of data signals DT1 to DT$n$ indicative of n-bit data, and FIG. 5 shows the arrangement of an output block which handles a second-bit data signal DT2 of the same.

Two power wirings $V_{D1}$ and $V_{D2}$ are connected to a power terminal T1 which is supplied with a high voltage or potential $V_{DD}$. Two power wirings $V_{S1}$ and $V_{S2}$ are also connected to a power terminal T2 which is supplied with a low voltage or potential $V_{SS}$. Inductances $L_{D1}$, $L_{D2}$, $L_{S1}$ and $L_{S2}$ exist, respectively, between the power wiring $V_{D1}$ and the power terminal T1, between the power wiring $V_{D2}$ and the power terminal T1, and between the power wiring $V_{S1}$ and the power terminal T2. These inductances are ascribed to IC package leads, bonding wires, etc.

A CMOS inverter as an output buffer OB1 is comprised of a P-channel MOS transistor P1 and an N-channel MOS transistor N1 which have their drains thereof connected together, a junction of which is connected to an output terminal O1. A capacitive load C1 is connected to the junction of the drains of the transistors P1, N1 via the output terminal O1. P-channel MOS transistors P11 and P12 are connected, respectively, between the source of the transistor N1 and the power wiring $V_{S1}$ and between the source of the transistor N1 and the power wiring $V_{S2}$.

A CMOS inverter as an output buffer OB2 is comprised of a P-channel MOS transistor P2 and an N-channel MOS transistor N2 which have their drains connected together, a function of which is connected to an output terminal O2. A capacitive load C2 is connected to the junction of the drains of the transistors P2, N2 via the output terminal O2. P-channel MOS transistors P21 and P22 are connected, respectively, between the source of the transistor P2 and the power wiring $V_{D1}$ and between the source of the transistor P2 and the power wiring $V_{D2}$. N-channel MOS transistors N21 and N22 are connected, respectively, between the source of the transistor N2 and the power wiring $V_{S1}$ and between the source of the transistor N2 and the power wiring $V_{S2}$.

Figure 6:
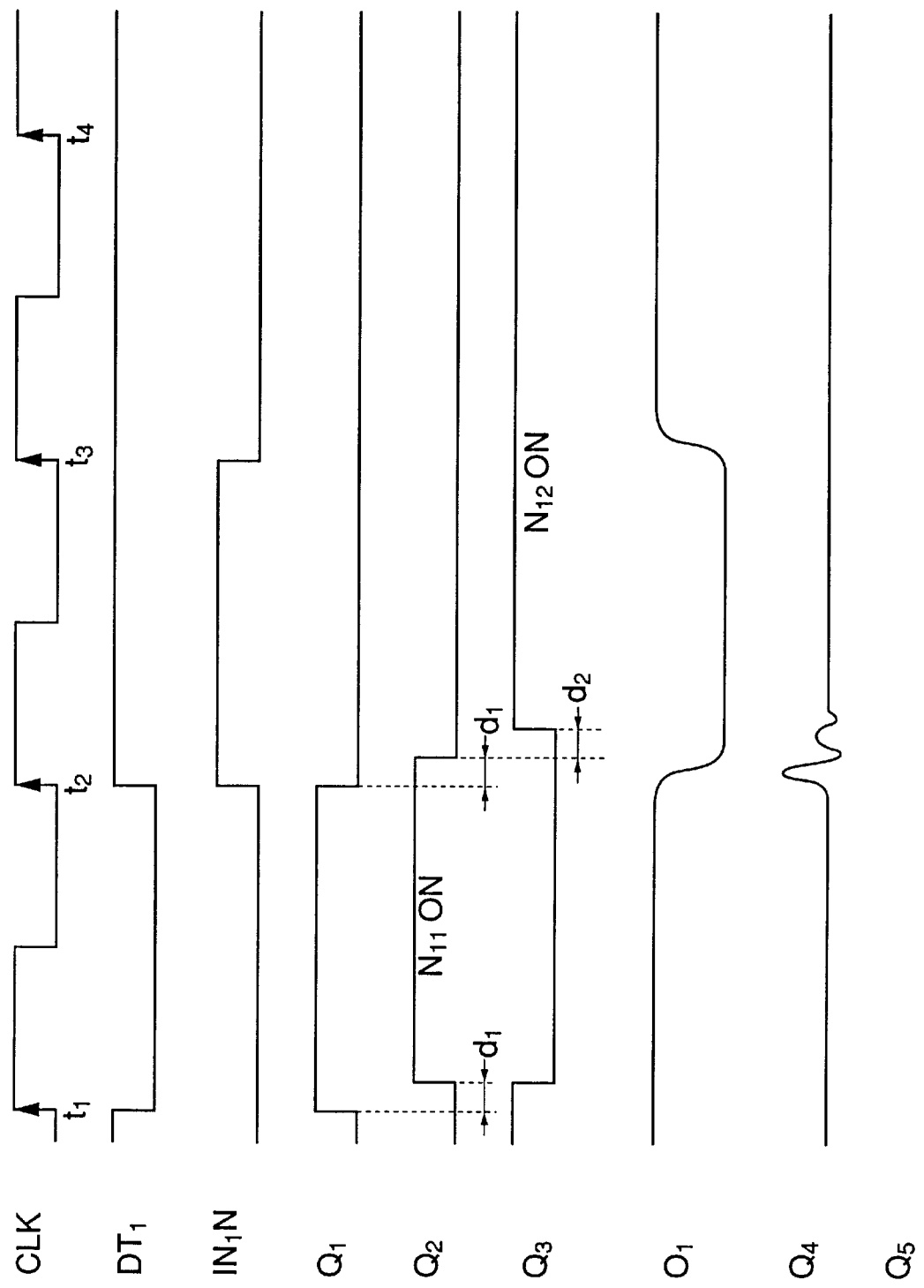
FIG. 6 is a timing chart useful in explaining an operation of the output circuit during discharging of a capacitive load connected to the output circuit of FIG. 4.

A D flip-flop circuit DF receives the data signal DT1 shown in FIG. 6 as input data D, and a clock signal CLK shown in FIG. 6 as a clock CK, and delivers a data signal IN1 which is obtained by delaying the data signal DT1 by a time period corresponding to one repetition period of the clock signal CLK via an output terminal OU to a prebuffer PB1.

The prebuffer PB1 has a construction and an operation identical with those described hereinbefore with reference to FIG. 1. That is, when the signal OEN is at "L" level, it delivers signals which are inverted in phase to the input data signal IN1, as output signals S1 and S2, while when the signal OEN is at "H" level, it delivers a "H" level signal and a "L" level signal as the output signals S1, S2, respectively, irrespective of the level of the input data signal IN1 to thereby turn the transistors P1, N1 off so that the output terminal O1 is brought into a high impedance (or floating) state.

The D flip-flop circuit DF generates an output signal IN1N (which is inverted in phase to the data signal IN1) as shown in FIG. 6, via the output terminal OUN. A NAND gate NA1 receives at its inputs the data signals DT1 and IN1N and generates an output signal Q1 as shown in FIG. 6. The D flip-flop circuit DF and the NAND gate NA1 cooperate to form a fall-differentiating circuit DN which detects a fall of the data signal DT1. A delay circuit DL1 receives at its input the output signal Q1 from the NAND gate NA1 and generates an output signal Q2 as shown in FIG. 6, which is delayed relative to the signal Q1 by a time period d1. The delay time period d1 is set to a suitable value depending upon the decay time of a ringing waveform Q4, hereinafter referred to, etc. The output signal Q2 is applied to the gate of the transistor N11 and also delivered to a delay circuit DL2 and a NAND gate NA2.

The delay circuit DL2 generates an output signal which is delayed relative to the signal Q2 by a time period d2. The delay time period d2 is also set to a suitable value depending upon the decay time of the ringing waveform Q4, etc. The NAND gate NA2 receives at its inputs the output signal from the delay circuit DL1 and the output signal Q2 from the delay circuit DL2 and generates an output signal Q3 as shown in FIG. 6, which is applied to the gate of the transistor N12.

A control circuit CN1 appearing in FIG. 5 includes a control block which generates output signals 2S1, 2S2, 2Q2, and 2Q3 in response to the data signal DT2 and the clock signal CLK. This control block has an identical construction with that of the control block in FIG. 4, which generates the aforementioned output signals S1, S2, Q2, and Q3, except that the data signal DT2 is input thereto in place of the data signal DT1. The output signals 2S1, 2S2, 2Q2, and 2Q3 correspond, respectively, to the output signals S1, S2, Q2, and Q3, and are applied to the gates of the respective transistors P2, N2, N21, and N22.

Now, the operation of the output circuit of FIGS. 4 and 5 constructed as above will be described with reference to FIG. 6.

Let it be assumed that the data signal DT1 changes from "H" level to "L" level at a time point t1 of generation of the clock signal CLK, and changes from "L" level to "H" level at a time point t2 of generation of the clock signal CLK. The D flip-flop circuit DF generates the data signal IN1N such that it rises to "H" level at the time point t2 of generation of the clock signal CLK and then falls to "L" level at a time point t3 of generation of the clock signal CLK. At the time point t2, the output signals S1, S2 from the prebuffer PB1 rise from "L" level to "H" level so that the transistors P1, N1 turn off and on, respectively. At this time, the transistor N11 is in ON state in response to the level of the output signal Q2 from the delay circuit DL1 which is at "H" level, and the transistor N12 is in OFF state in response to the level of the output signal Q3 from the NAND gate NA2 which is at "L" level. Accordingly, the capacitive load C1 is discharged through a path of output terminal O1, transistor N1, transistor N11, power wiring $V_{S1}$, and inductance $L_{S1}$. The ringing waveform Q4 is produced at a point X1 on the power wiring $V_{S1}$ due to the discharge current.

Let it be assumed that at this time the transistors P2, N2 of the output buffer OB2 are in OFF state and in ON state, respectively (the output signal from the output terminal O2 is at "L" level) in response to the levels of the output signals 2S1, 2S2 from the control circuit CN1 which are both at "H" level. Then, the transistors N21, N22 are in OFF state and in ON state, respectively, in response to the levels of the output signals 2Q2, 2Q3 from the control circuit CN1 which are at "L" level and "H" level, respectively. Since the transistor N21 is in OFF state, the ringing waveform Q4 does not appear at the output terminal O2. Therefore, an LSI connected to the output of the output circuit can be prevented from malfunctioning.

Immediately after the timing point t2, the transistor N12 is in OFF state so that no ringing waveform appears at a point X2 on the power wiring $V_{S2}$, as shown at Q5 in FIG. 6.

Thereafter, when the output signal Q2 changes from "H" level to "L" level upon the lapse of the time period d1 from the time point t2, the transistor N11 turns off. Then, when the output signal Q3 changes from "L" level to "H" level upon the lapse of the time period d2 from the time point of turning-off of the transistor N11, the transistor N12 turns on. At this time, the ringing waveform Q4 has almost completely decayed, and accordingly no ringing waveform appears at the point X2, as shown at Q5 in FIG. 6. Therefore, in the output block of FIG. 5, even when the transistor N22 is in ON state, no ringing waveform appears at the output terminal O2, thereby making it possible to prevent malfunctioning of the LSI connected to the output of the output circuit.

The output signal at the output terminal O1 changes from "H" level to "L" level as the transistors N1, P1 turn on and off, respectively, at the time point t2, and then changes from "L" level to "H" level as the transistors N1, P1 turn off and on, respectively, at the time point t3, as shown at Q1 in FIG. 6.

Next, a control block for controlling the transistors P1, P11, P12, P2, P21, and P22 will be described.

Figure 3:
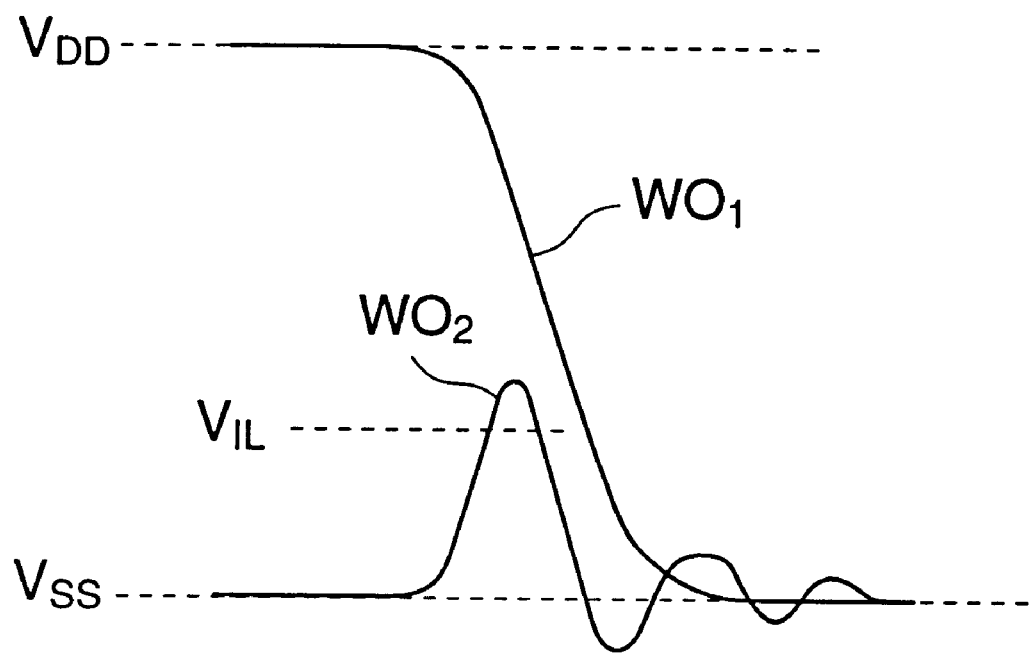
FIG. 3 is a diagram showing waveforms, which is useful in explaining the operation of the circuit of FIG. 2.
Figure 7:
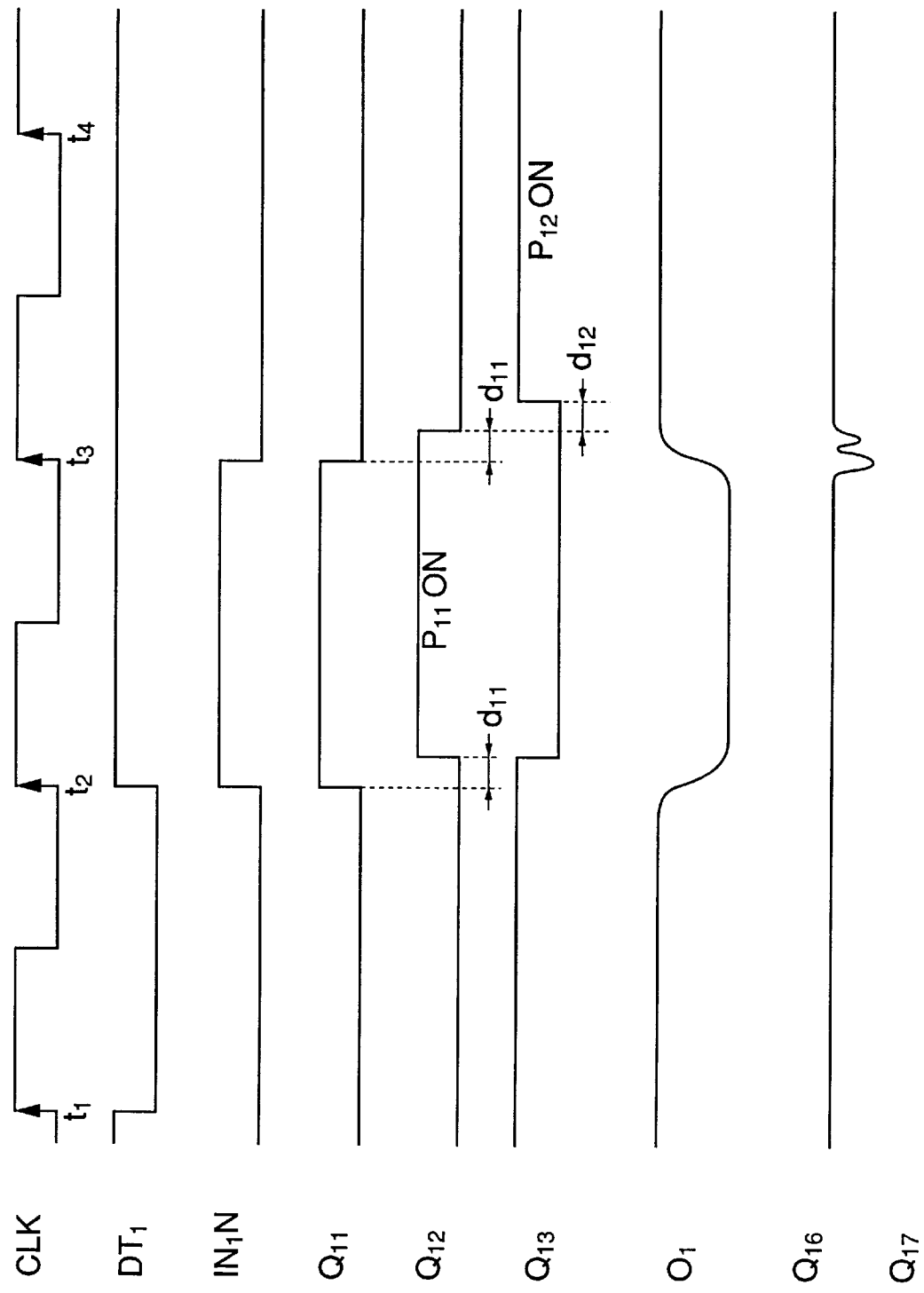
FIG. 7 is a timing chart useful in explaining an operation of the output circuit during charging of a capacitive load connected to the output circuit of FIG. 4.

An AND gate AN receives at its inputs the data signals DT1, IN1N and generates an output signal Q11 as shown in FIG. 7. Clock signal CLK and data signals DT1, IN1N shown in FIG. 7 correspond to those shown in FIG. 3, described above. The D flip-flop circuit DF and the AND gate AN cooperate to form a rise-differentiating circuit UP for detecting a rise of the data signal DT1. A delay circuit DL11 receives at its input the output signal Q11 from the AND gate AN and generates a signal Q12 as shown in FIG. 7, which is delayed relative to the signal Q11 by a time period d11. The delay time period d11 is set to a suitable value depending upon the decay time of a ringing waveform Q16, referred to hereinafter, etc. The output signal Q12 from the delay circuit DL11 is inverted by an inverter IV1 into an inverted signal Q14, which is applied to the gate of the transistor P11 and also delivered to a delay circuit DL12 and a NAND gate NA3.

The delay circuit DL12 generates an output signal which is delayed relative to the input signal Q12 by a time period d12. The delay time period d12 is also set to a suitable value depending upon the decay time of the ringing waveform Q16, etc. The NAND gate NA3 receives at its inputs the output signal Q12 from the delay circuit DL11 and the output signal from the delay circuit DL12 and generates an output signal Q13 as shown in FIG. 7. The output signal Q13 is applied to the gate of the transistor P12 after being inverted into an inverted signal Q15 by an inverter IV2.

The control circuit CN1 includes a control block for generating output signals 2Q14 and 2Q15, in response to the data signal DT2 and the clock signal CLK. The construction of this control block is identical with that of the control block for generating the output signals Q14, Q15 except that the data signal DT2 is input to the present control block in place of the data signal DT1.

Now, the operation of the output circuit of FIGS. 4 and 5 will be described with reference to FIG. 7.

At the time point t3, the output signals S1, S2 from the prebuffer PB1 change from "H" level to "L" level, so that the transistors P1, N1 turn on and off, respectively. At this time, the transistor P11 is in ON state in response to the level of the output signal Q14 from the inverter IV1 which is at "L" level, and the transistor P12 is in OFF state in response to the level of the output signal Q15 from the inverter IV2 which is at "H" level. Accordingly, the capacitive load C1 is charged through a path of inductance $L_{D1}$, power wiring $V_{D1}$, transistor P11, transistor P1, and output terminal Q1. The ringing waveform Q16 is produced at a point Y1 on the power wiring $V_{D1}$ due to the charge current.

Let it be assumed that at this time the transistors P2, N2 of the output buffer OB2 are in ON state and in OFF state, respectively (the output signal from the output terminal O2 is at "H" level) in response to the levels of the output signals 2S1, 2S2 from the control circuit CNB1 which are both at "L" level. Then, the transistors P21, P22 are in OFF state and in ON state, respectively, in response to the levels of the output signals 2Q14, 2Q15 which are at "H" level and "L" level, respectively. Since the transistor P21 is in OFF state, the ringing waveform Q16 does not appear at the output terminal O2. Therefore, the LS1 connected to the output of the output circuit can be prevented from malfunctioning.

Immediately after the time point t3, the transistor P12 is in OFF state, and therefore no ringing waveform appears at a point Y2 on the power wiring $V_{D2}$, as shown at Q17 in FIG. 7.

Thereafter, when the output signal Q12 changes from "H" level to "L" level upon the lapse of the time period d11 from the time point t3, the transistor P11 turns off. Then, when the output signal Q13 changes from "L" level to "H" level upon the lapse of the time period d12 from the time point of turning-off of the transistor P11, the transistor P12 turns on. At this time, the ringing waveform Q16 has almost completely decayed, and accordingly no ringing waveform appears at the point Y2, as shown at Q17 in FIG. 7. Therefore, in the output block of FIG. 5, even when the transistor P22 is in ON state, no ringing waveform appears at the output terminal O2, thereby making it possible to prevent malfunctioning of the LSI connected to the output of the output circuit.

Output blocks handling a third-bit data signal and subsequent bit data signals are constructed and operate similarly to the output blocks handling the first-bit and second-bit data signals described above by referring to FIGS. 4 and 5. In the operation of the circuit of FIGS. 4 and 5, while ringing waveforms occur on the power wirings $V_{D1}$, $V_{S1}$ of the four power wirings $V_{D1}$, $V_{D2}$, $V_{S1}$, and $V_{S2}$, no ringing waveform occurs on the power wirings $V_{D2}$, $V_{S2}$, which are therefore clean wirings.

According to the output circuit of FIGS. 4 and 5, malfunctioning of a device connected to the output of the output circuit which is caused by charging or discharging of the capacitive loads can be prevented. Further, the number of power wirings employed can be no more than four even if the number of bits of the data signals is increased.

Figure 8:
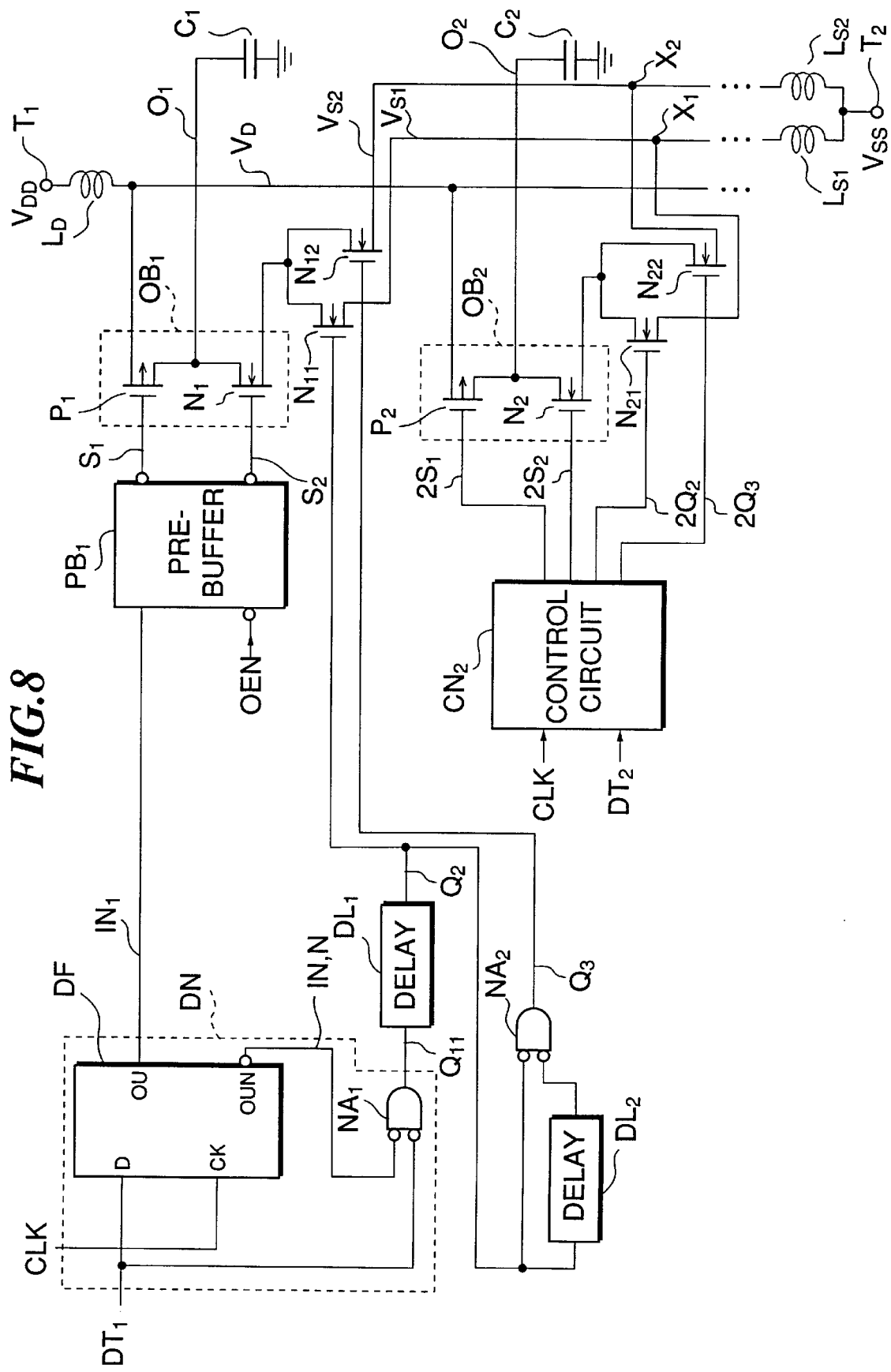
FIG. 8 is a circuit diagram showing the arrangement of an output circuit for an integrated circuit device according to a second embodiment of the invention.

FIG. 8 shows the arrangement of an output circuit for an integrated circuit device according to a second embodiment of the invention. In the figure, elements, signals and parameters corresponding to those in FIGS. 4 and 5 are designated by identical reference numerals, detailed description of which is omitted.

The output circuit of FIG. 8 is characterized in that the ringing waveform-preventing means provided on the P-channel MOS transistor side of each CMOS inverter is omitted. More specifically, a single power wiring $V_D$ is connected to a power wiring T1, to which are connected the sources of transistors P1 and P2. In the figure, the symbol $L_D$ designates an inductance similar to the inductance $L_D$ described before with reference to FIG. 1, and CN2 a control circuit for generating output signals 2S1, 2S2, 2Q2, and 2Q3, based on a data signal DT2 and a clock signal CLK.

According to the output circuit of FIG. 8, not only malfunctioning of a device connected to the output thereof, caused by charging or discharging of the capacitive loads such as C1 and C2 can be prevented similarly to the output circuit of FIGS. 4 and 5, but also the number of power wirings employed can be decreased to three. The output circuit of FIG. 8 is suitable for use in a case where there is no possibility of malfunctioning of the device connected to the output, which is caused by a ringing waveform due to the inductance $L_D$.

Figure 9:
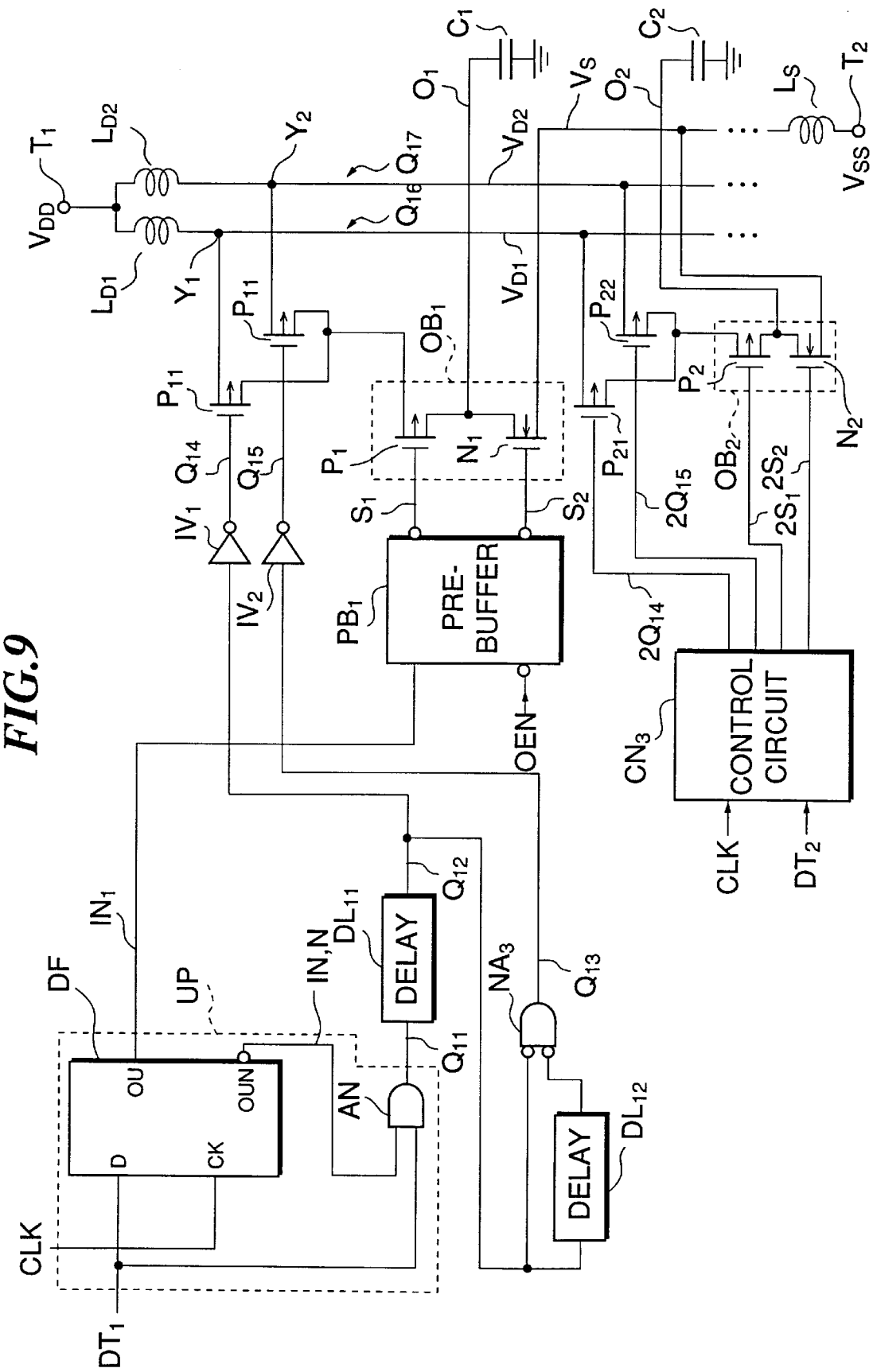
FIG. 9 is a circuit diagram showing the arrangement of an output circuit for an integrated circuit device according to a third embodiment of the invention.

FIG. 9 shows the arrangement of an output circuit for an integrated circuit device according to a third embodiment of the invention. In the figure, elements, signals and parameters corresponding to those in FIGS. 4 and 5 are designated by identical reference numerals, detailed description of which is omitted.

The output circuit of FIG. 9 is characterized in that the ringing waveform-preventing means provided on the N-channel MOS transistor side of each CMOS inverter is omitted. More specifically, a single power wiring $V_S$ is connected to a power wiring T2, to which are connected the sources of transistors N1 and N2. In the figure, the symbol $L_S$ designates an inductance similar to the inductance $L_S$ described before with reference to FIG. 1, and CN3 a control circuit for generating output signals 2S1, 2S2, 2Q14, and 2Q15, based on a data signal DT2 and a clock signal CLK.

According to the output circuit of FIG. 9, not only malfunctioning of a device connected to the output thereof, caused by charging or discharging of the capacitive loads such as C1 and C2 can be prevented similarly to the output circuit of FIGS. 4 and 5 but also the number of power wirings employed can be decreased to three. The output circuit of FIG. 9 is suitable for use in a case where there is no possibility of malfunctioning of the device connected to the output, which is caused by a ringing waveform due to the inductance $L_S$.

Figure 10:
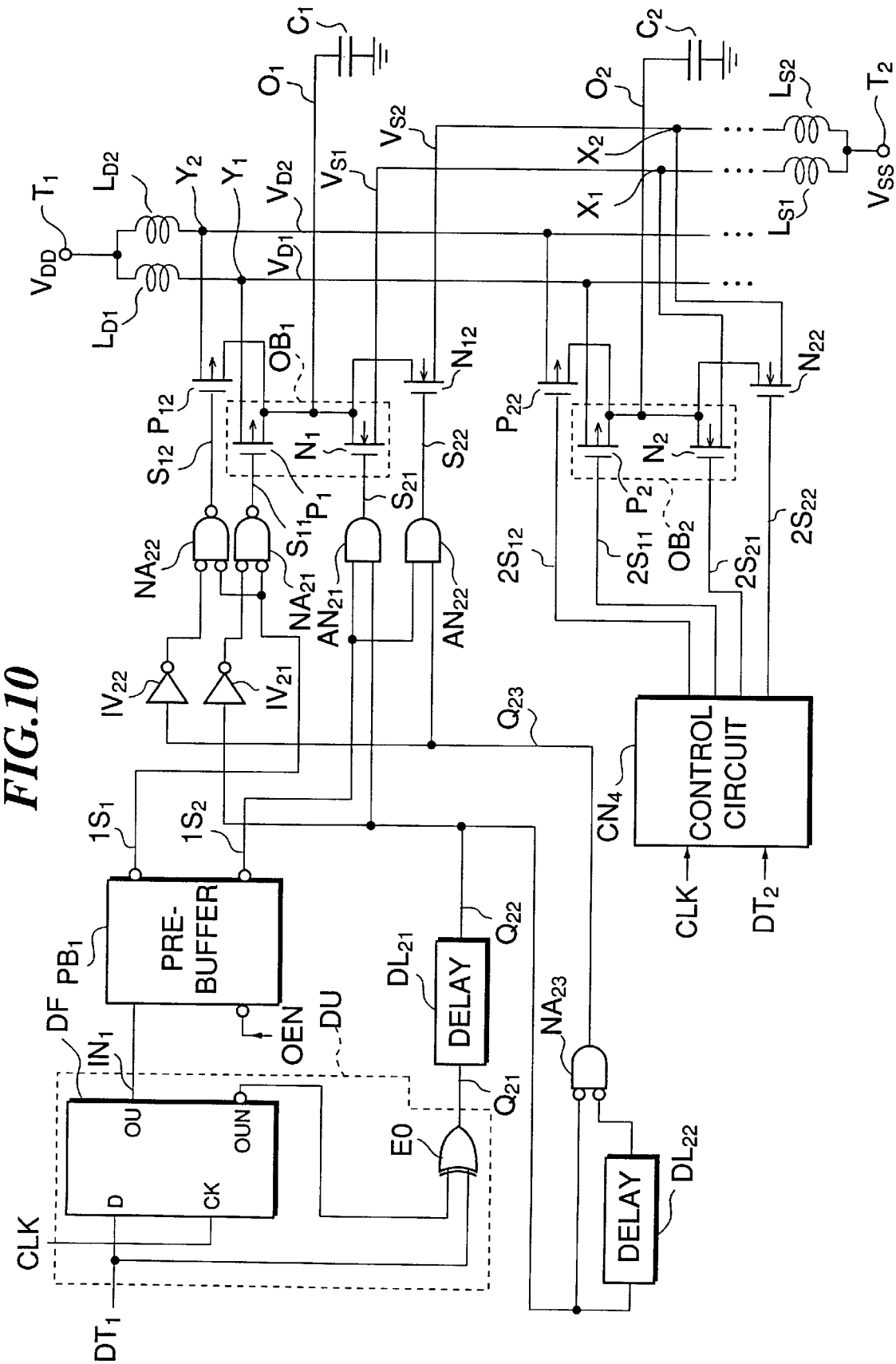
FIG. 10 is a circuit diagram showing the arrangement of an output circuit for an integrated circuit device according to a fourth embodiment of the invention.

FIG. 10 shows the arrangement of an output circuit for an integrated circuit device according to a fourth embodiment of the invention. In the figure, elements, signals and parameters corresponding to those in FIGS. 4 and 5 are designated by identical reference numerals, detailed description of which is omitted. In FIG. 10, there are shown only parts of the output circuit according to the fourth embodiment, i.e. an output block for a first-bit data signal including an output buffer OB1 and an output block for a second-bit data signal including an output buffer OB2.

Transistors P1 and P2 have their sources connected to a power wiring $V_{D1}$. P-channel MOS transistors P12 and P22 are connected, respectively, between a power wiring $V_{D2}$ and the drain of the transistor P1, and between the power wiring $V_{D2}$ and the drain of the transistor P2.

Transistors N1 and N2 have their sources connected to a power wiring $V_{S1}$. N-channel MOS transistors N12 and N22 are connected, respectively, between a power wiring $V_{S2}$ and the drain of the transistor N1, and between the power wiring $V_{S2}$ and the drain of the transistor N2.

Figure 11:
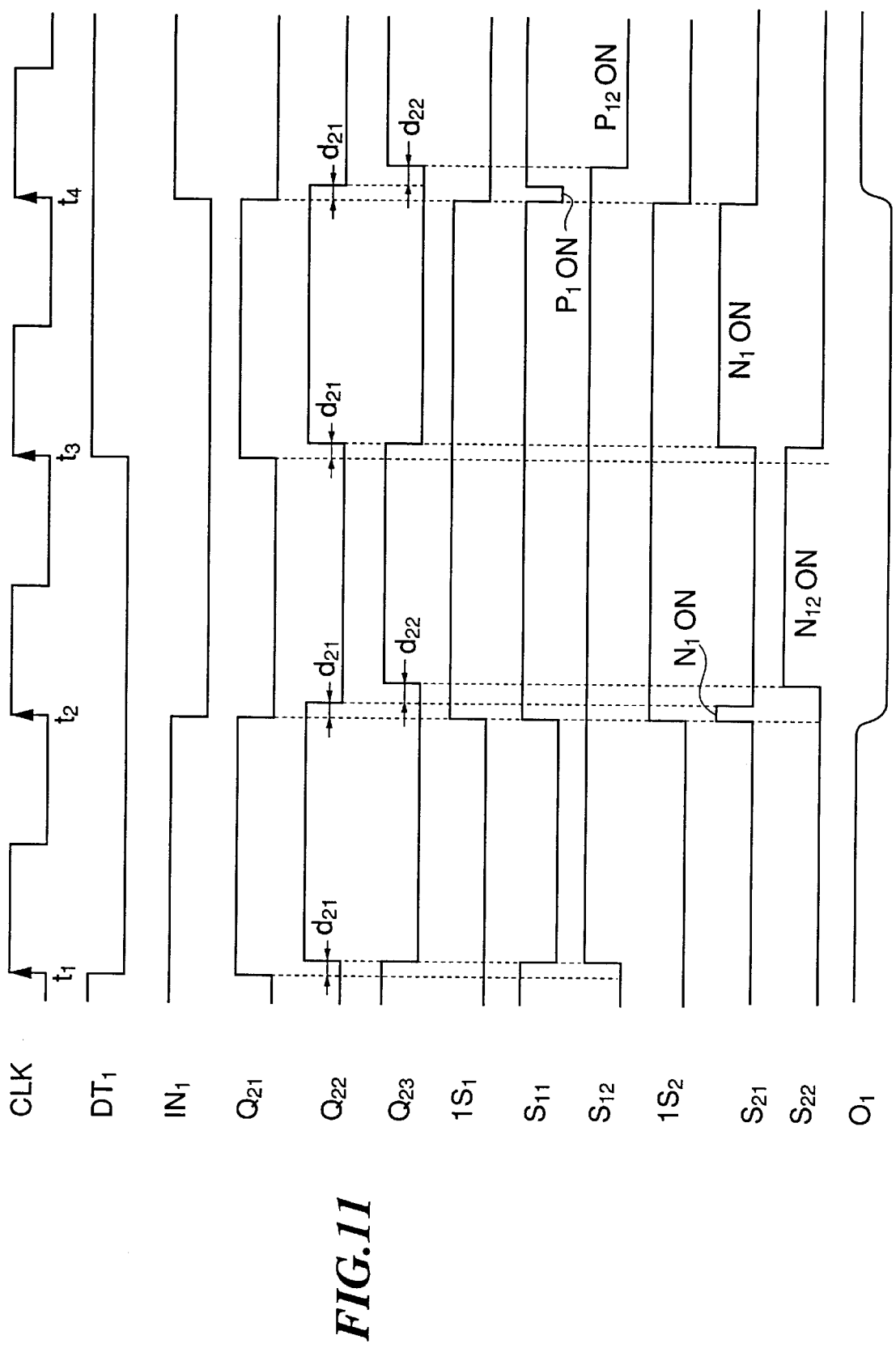
FIG. 11 is a timing chart useful in explaining an operation of the output circuit of FIG. 10.

A D flip-flop circuit DF generates through an output terminal OU thereof a data signal IN1 which is obtained by delaying a data signal DT1 input thereto by a time period corresponding to one repetition period of a clock signal CLK, as shown in FIG. 11, and delivers the same to a prebuffer PB1 and an exclusive-OR gate EO.

The exclusive-OR gate EO delivers an output signal Q21 as shown in FIG. 11, based on the data signals DT1 and IN1.

The D flip-flop circuit DF and the exclusive-OR gate EO cooperate to form a rise/fall-differentiating circuit DU for detecting a rise and a fall of the data signal DT1.

A delay circuit DL21 receives at its input the output signal Q21 from the exclusive-OR gate EO, and generates an output signal Q22 which is delayed relative to the signal Q21 by a time period d21, as shown in FIG. 11. The delay time period d21 is set to a suitable value depending upon the decay time of a ringing waveform such as ones Q4 and Q16, referred to before, etc. The output signal Q22 is applied to an AND gate AN21 and also to a NAND gate NA21 via an inverter IV21.

The AND gate AN21 generates an output signal S21 as shown in FIG. 11, based on the output signal Q22 from the delay circuit DL21 and an output signal 1S2 from the prebuffer PBA as shown in FIG. 11, and delivers the same to the gate of the transistor N1. The NAND gate NA21 generates an output signal S11 as shown in FIG. 11, based on an output signal from the inverter IV21 and an output signal IS1 from the prebuffer PB1 as shown in FIG. 11, and delivers the same to the gate of the transistor P1.

A delay circuit DL22 generates an output signal which is delayed relative to the output signal Q22 from the delay circuit DL21 by a time period d22. The delay time period d22 is set to a suitable value depending upon the decay time of a ringing waveform such as ones Q4 and Q16, referred to before, etc.

A NAND gate NA23 receives at its inputs the output signals from the delay circuits DL21, DL22 and generates an output signal Q23 as shown in FIG. 11. The output signal Q23 is delivered to an AND gate AN22 and also to an NAND gate NA22 via an inverter IV22. The AND gate NA22 generates an output signal S22 as shown in FIG. 11, based on the output signal Q23 and the output signal 1S2 from the prebuffer PB1, and delivers the same to the gate of the transistor N12. The NAND gate NA22 generates an output signal S12 as shown in FIG. 11, based on an output signal from the inverter IV22 and the output signal 1S1 from the prebuffer PB1, and delivers the same to the gate of the transistor P12.

A control circuit CN4 includes a control block which generates output signals 2S11, 2S12, and 2S22, in response to the data signal DT2 and the clock signal CLK. This control block has an identical construction with that of the control block which generates the aforementioned output signals S11, S12, S21, and S22, except that the data signal DT2 is input thereto in place of the data signal DT1. The output signals 2S11, 2S12, 2S21, and 2S22 correspond, respectively, to the output signals S11, S12, S21, and S22, and are applied to the gates of the respective transistors P2, P22, N2, and N22.

Next, the operation of the circuit of FIG. 10 will be described with reference to FIG. 11.

At a time point t2, the output signal S11 from the NAND gate NA21 and the output signal S21 from the AND gate AN21 both rise from "L" level to "H" level, so that the transistors P1, N1 turn off and on, respectively. At this time, the transistor N12 is in OFF state in response to the level of the output signal S22 from the AND gate AN22, which is at "L" level. Accordingly, the capacitive load C1 is discharged through a path of output terminal O1, transistor N1, power wiring $V_{S1}$, and inductance $L_{S1}$. Then, a ringing waveform as shown at Q4 in FIG. 6 is produced due to the discharge current.

Let it be assumed that at this time the transistor P2, N22 are in OFF state and in ON state, respectively (the output signal from the output terminal O2 is at "L" level), in response to the levels of the output signals 2S11, 2S22 from the control circuit CN4 which are both at "H" level. The transistor N2 is in OFF state in response to the level of the output signal 2S21 from the control circuit CN4, which is at "L" level. Since the transistor N2 is in OFF state, no ringing waveform appears at the output terminal O2. Therefore, malfunctioning of a device connected to the output terminal can be prevented.

Immediately after the time point t2, the transistor N12 is in OFF state, and accordingly no ringing waveform appears at a point X2 on the power wiring $V_{S2}$.

Then, when the output signal Q22 changes from "H" level to "L" level upon the lapse of the time period d21 from the time point t2, the transistor N1 turns off. Thereafter, when the output signal Q23 changes from "L" level to "H" level upon the lapse of the time period d22 from the time the transistor N1 turns off, the transistor N12 turns on. Since at this time the ringing waveform has almost completely decayed, no ringing waveform then appears at the point X2. Accordingly, in the output block for the second-bit data signal, no ringing waveform appears at the output terminal O2 even when the transistor N22 is in ON state, to thereby prevent malfunctioning of the device or LSI connected to the output.

Thereafter, at a time point t3, the output signal Q21 rises from "L" level to "H" level in response to a rise of the data signal DT1, and the output signal Q22 rises from "L" level to "H" level upon the lapse of the time period d21 from the rise of the output signal Q21. Responsive to the rise of the output signal Q22, the output signal Q23 falls to "L" level, so that the transistors N1, N12 turn on and off, respectively, in response to the state that Q22 ="H" and Q23="L".

Then, at a time point t4, the output signals 1S1, 1S2 from the prebuffer PB1 both fall from "H" level to "L" level, so that the transistors P1, N1 turn on and off, respectively. At this time, the transistor P12 is in OFF state in response to the level of the output signal S12 from the NAND gate NA22 which is at "H" level. Accordingly, the capacitive load C1 is charged through a path of inductance $L_{D1}$, power wiring $V_{D1}$, transistor P1, and output terminal O1. Then, a ringing waveform as shown at Q16 in FIG. 7 is produced at the point Y1 on the power wiring $V_{D1}$.

Let it be assumed that at this time, in the output block for the second-bit data signal, the transistors P22, N2 are in ON state and in OFF state, respectively (the output signal is at "H" level), in response to the levels of the output signals 2S12, 2S21 from the control circuit CN4, which are both at "L" level. Then, the transistor P2 is in OFF state in response to the level of the output signal 2S11 from the control circuit CN4 which is at "H" level. Since the transistor P2 is in OFF state, no ringing waveform appears at the output terminal O2, thereby preventing malfunctioning of the LSI.

Immediately after the time point t4, the transistor P12 is in OFF state, and hence no ringing waveform appears at the point Y2 on the power wiring $V_{D2}$.

When the output signal Q22 falls from "H" level to "L" level upon the lapse of the time period d21 from the time point t4, the transistor P1 turns off. Then, when the output signal Q23 rises from "L" level to "H" level upon the lapse of the time period d22 from the time of turning-off of the transistor P1, the transistor P1 turns on. At this time, the ringing waveform has almost completely decayed, and hence no ringing waveform appears at the point Y2. Therefore, in the output block for the second-bit data signal, no ringing waveform appears at the output terminal O2 even when the transistor P22 is in ON state, thereby preventing malfunctioning of the LSI.

The signal at the output terminal O1 changes as shown at O1 in FIG. 11. That is, first, at the time point t2, it changes from "H" level to "L" level as the transistors N1, P1 turn on and off, respectively, and is thereafter held at the "L" level as the transistor N1 turns off, followed by turning-on of the transistor N12. Then, at the time point t3, the signal is further held at "L" level as the transistors N12, N1 turn off and on, respectively. Then, at the time point t4, it changes from "L" level to "H" level as the transistors N1, P1 turn off and on, respectively, and is thereafter held at "H" level as the transistor P1 turns off, followed by turning-on of the transistor P12.

Output blocks handling a third-bit data signal and subsequent bit data signals are constructed and operate similarly to the output blocks handling the first-bit and second-bit data signals described above by referring to FIG. 10. In the operation of the circuit of FIG. 10, while ringing waveforms occur on the power wirings $V_{D1}$, $V_{S1}$ of the four power wirings $V_{D1}$, $V_{D2}$, $V_{S1}$, and $V_{S2}$, no ringing waveform occurs on the power wirings $V_{D2}$, $V_{S2}$, which are therefore clean wirings.

According to the output circuit of FIG. 10, malfunctioning of a device connected to the output of the output circuit, which is caused by charging or discharging of the capacitive loads can be prevented. Further, the number of power wirings employed can be no more than four even if the number of bits of the data signals is increased. Furthermore, as compared with the output circuit of FIGS. 4 and 5, the output circuit of FIG. 10 has a lesser number of transistors by two for each CMOS inverter. In this connection, in the output buffer OB1, the transistors P12, N12 can be smaller in size than the transistors P1, P2, respectively. This is the same with the other output buffers.

Figure 12:
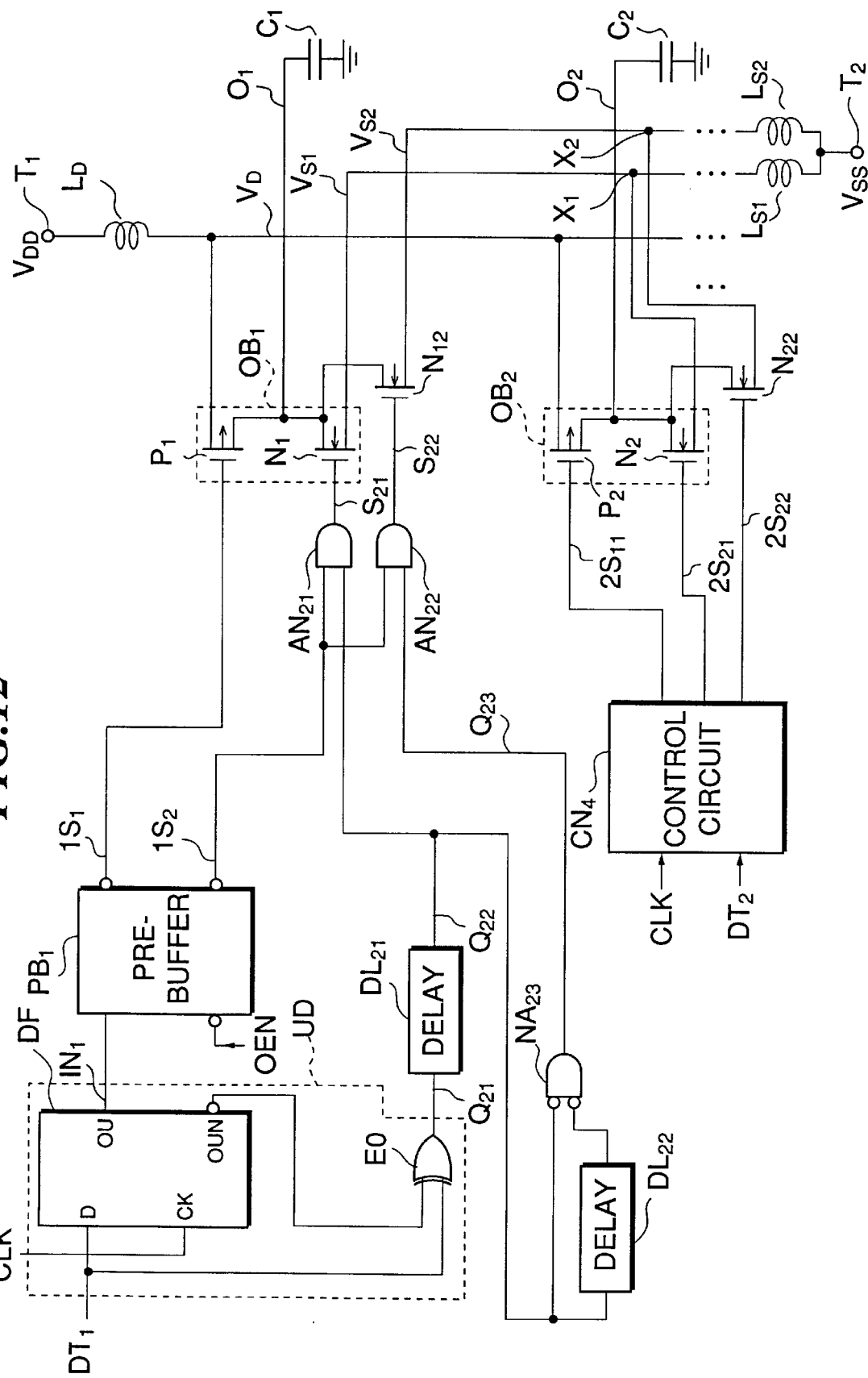
FIG. 12 is a circuit diagram showing the arrangement of an output circuit for an integrated circuit device according to a fifth embodiment of the invention.

FIG. 12 shows the arrangement of an output circuit for an integrated circuit device according to a fifth embodiment of the invention. In the figure, elements, signals and parameters corresponding to those in FIG. 10 are designated by identical reference numerals, detailed description of which is omitted.

The output circuit of FIG. 12 is characterized in that the ringing waveform-preventing means provided on the P-channel MOS transistor side of each CMOS inverter is omitted. More specifically, a single power wiring $V_D$ is connected to a power wiring T1, to which are connected the sources of transistors P1 and P2. In the figure, the symbol $L_D$ designates an inductance similar to the inductance $L_D$ described before with reference to FIG. 1, and CN5 a control circuit for generating output signals 2S11, 2S21, and 2S22, based on a data signal DT2 and a clock signal CLK.

According to the output circuit of FIG. 12, not only malfunctioning of a device connected to the output thereof, caused by charging or discharging of the capacitive loads such as C1 and C2 can be prevented similarly to the output circuit of FIG. 10, but also the number of power wirings employed can be decreased to three. The output circuit of FIG. 12 is suitable for use in a case where there is no possibility of malfunctioning of the device connected to the output, which is caused by a ringing waveform due to the inductance $L_D$.

Figure 13:
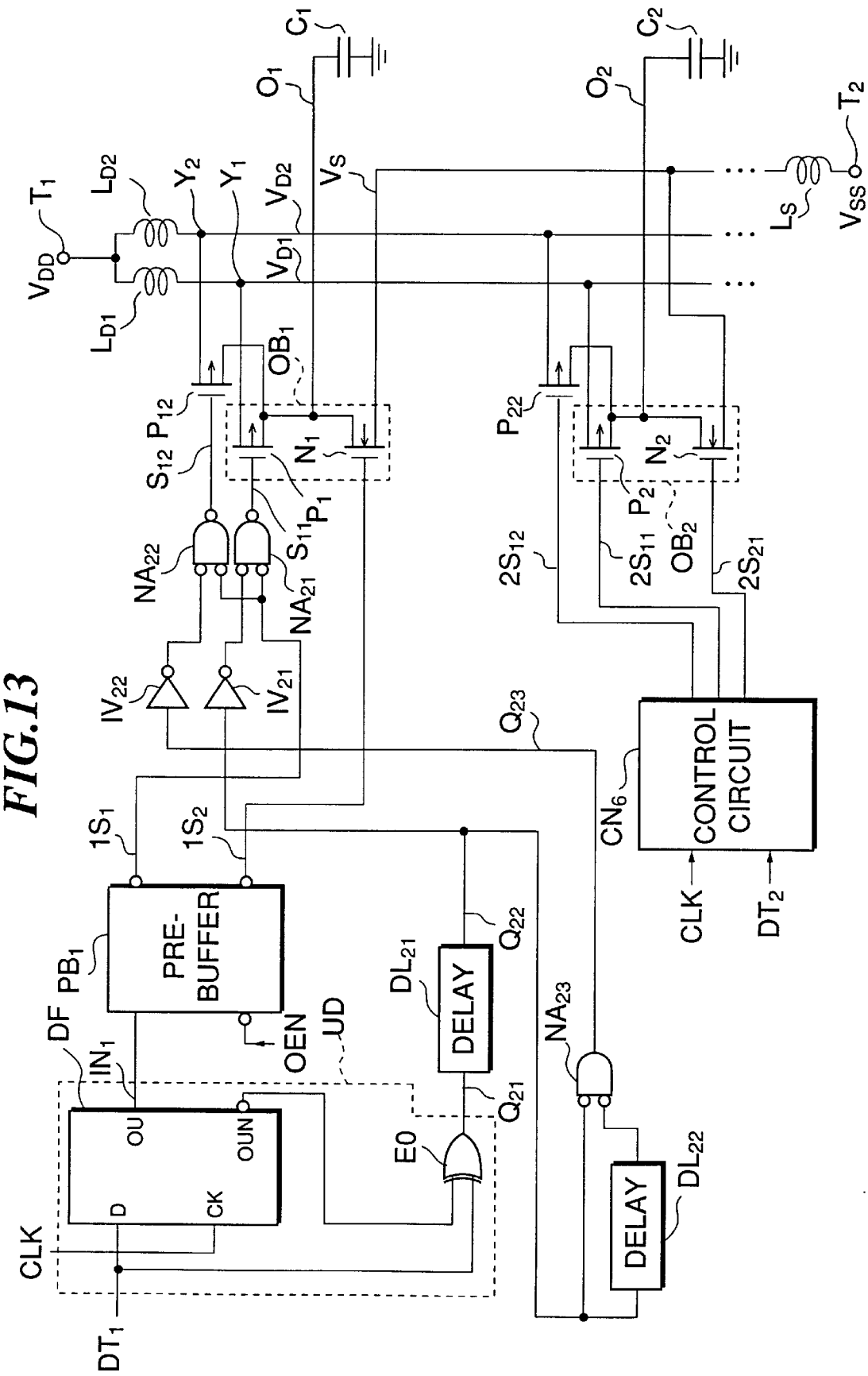
FIG. 13 is a circuit diagram showing the arrangement of an output circuit for an integrated circuit device according to a sixth embodiment of the invention.

FIG. 13 shows the arrangement of an output circuit for an integrated circuit device according to a sixth embodiment of the invention. In the figure, elements, signals and parameters corresponding to those in FIG. 10 are designated by identical reference numerals, detailed description of which is omitted.

The output circuit of FIG. 13 is characterized in that the ringing waveform-preventing means provided on the N-channel MOS transistor side of each CMOS inverter is omitted. More specifically, a single power wiring $V_S$ is connected to a power wiring T2, to which are connected the sources of transistors N1 and N2. In the figure, the symbol $L_S$ designates an inductance similar to the inductance $L_S$ described before with reference to FIG. 1, and CN6 a control circuit for generating output signals 2S11, 2S21, and 2S12, based on a data signal DT2 and a clock signal CLK.

According to the output circuit of FIG. 13, not only malfunctioning of a device connected to the output thereof, caused by charging or discharging of the capacitive loads such as C1 and C2 can be prevented similarly to the output circuit of FIG. 10, but also the number of power wirings employed can be decreased to three. The output circuit of FIG. 13 is suitable for use in a case where there is no possibility of malfunctioning of the device connected to the output, which is caused by a ringing waveform due to the inductance $L_S$.

What is claimed is:

1. An output circuit for an integrated circuit device, comprising:

a first power terminal which is supplied with a high potential;

first and second power wirings connected to said first power terminal;

a second power terminal which is supplied with a low potential;

third and fourth power wirings connected to said second power terminal;

a plurality of inverters responsive, respectively, to a plurality of bit signals constituting a data signal, each of said inverters being formed of P-channel and N-channel MOS transistors having drains thereof connected together, a junction of which forms an output terminal;

first to fourth auxiliary transistors provided for each of said inverters and each having a source, said first auxiliary transistor being connected between said first power wiring and the source of said P-channel MOS transistor, said second auxiliary transistor being connected between said second power wiring and the source of said P-channel MOS transistor, said third auxiliary transistor being connected between said third power wiring and the source of said N-channel MOS transistor, and said fourth auxiliary transistor being connected between said fourth power wiring and the source of said N-channel MOS transistor;

a first circuit provided for said each of said inverters and operable in response to one of said bit signals corresponding to said each of said inverters, for controlling said third and fourth auxiliary transistors such that said third auxiliary transistor is in ON state during a first predetermined time period including timing of turning-on of said N-channel MOS transistor, and turned off after termination of said first predetermined period, and said fourth auxiliary transistor is turned on after the turning-off of said third auxiliary transistor; and a second circuit provided for said each of said inverters and operable in response to said one of said bit signals corresponding to said each of said inverters, for controlling said first and second auxiliary transistors such that said first auxiliary transistor is in ON state during a second predetermined time period including timing of turning-on of said P-channel MOS transistor, and turned off after termination of said second predetermined period, and said second auxiliary transistor is turned on after the turning-off of said first auxiliary transistor.

2. An output circuit for an integrated circuit device, comprising:

a first power terminal which is supplied with a high potential;

a first power wiring connected to said first power terminal;

a second power terminal which is supplied with a low potential;

second and third power wirings connected to said second power terminal;

a plurality of inverters responsive, respectively, to a plurality of bit signals constituting a data signal, each of said inverters being formed of P-channel and N-channel MOS transistors having drains thereof connected together, a junction of which forms an output terminal, said P-channel MOS transistor having a source thereof connected to said first power wiring;

first and second auxiliary transistors provided for each of said inverters and each having a source, said first auxiliary transistor being connected between said second power wiring and the source of said N-channel MOS transistor, and said second auxiliary transistor being connected between said third power wiring and the source of said N-channel MOS transistor; and a circuit provided for said each of said inverters and operable in response to one of said bit signals corresponding to said each of said inverters, for controlling said first and second auxiliary transistors such that said first auxiliary transistor is in ON state during a predetermined time period including timing of turning-on of said N-channel MOS transistor, and turned off after termination of said predetermined period, and said second auxiliary transistor is turned on after the turning-off of said first auxiliary transistor.

3. An output circuit for an integrated circuit device, comprising:

a first power terminal which is supplied with a high potential;

first and second power wirings connected to said first power terminal;

a second power terminal which is supplied with a low potential;

a third power wiring connected to said second power terminal;

a plurality of inverters responsive, respectively, to a plurality of bit signals constituting a data signal, each of said inverters being formed of P-channel and N-channel MOS transistors having drains thereof connected together, a junction of which forms an output terminal, said N-channel MOS transistor having a source thereof connected to said third power wiring;

first and second auxiliary transistors provided for each of said inverters and each having a source, said first auxiliary transistor being connected between said first power wiring and the source of said P-channel MOS transistor, and said second auxiliary transistor being connected between said second power wiring and the source of said P-channel MOS transistor; and a circuit provided for said each of said inverters and operable in response to one of said bit signals corresponding to said each of said inverters, for controlling said first and second auxiliary transistors such that said first auxiliary transistor is in ON state during a predetermined time period including timing of turning-on of said P-channel MOS transistor, and turned off after termination of said predetermined period, and said second auxiliary transistor is turned on after the turning-off of said first auxiliary transistor.

* * * * *